United States Patent [19]

Vanderveer et al.

[11] 3,954,569

[45] May 4, 1976

[54] METHOD OF ELECTROFORMING NICKEL ON PRINTED CIRCUIT BOARDS

[75] Inventors: Ramon D. Vanderveer, Mission Viejo; William P. Dugan, Ontario, both of Calif.

[73] Assignee: General Dynamics Corporation, Pomona, Calif.

[22] Filed: Dec. 20, 1974

[21] Appl. No.: 534,994

Related U.S. Application Data

[62] Division of Ser. No. 395,869, Sept. 10, 1973.

[52] U.S. Cl. .................................. 204/15; 204/285; 204/DIG. 7
[51] Int. Cl.² .......................................... C25D 5/02
[58] Field of Search ................ 204/15, DIG. 7, 283, 204/284, 285, 287

[56] References Cited

UNITED STATES PATENTS

| 2,559,926 | 7/1951 | Beebe | 204/287 |
| 3,429,786 | 2/1969 | Kubik | 204/15 |

FOREIGN PATENTS OR APPLICATIONS

| 519,197 | 12/1955 | Canada | 204/285 |

OTHER PUBLICATIONS

German Printed Application M14015, June 21, 1956.

*Primary Examiner*—T. M. Tufariello
*Attorney, Agent, or Firm*—Albert J. Miller; Edward B. Johnson

[57] ABSTRACT

Anode shields are provided around the anode baskets in an electroforming process.

5 Claims, 2 Drawing Figures

METHOD OF ELECTROFORMING NICKEL ON PRINTED CIRCUIT BOARDS

This is a division, of application Ser. No. 395,869 filed Sept. 10, 1973, pending.

BACKGROUND OF THE INVENTION

One of the principal steps in the process of manufacturing a printed circuit board is the electroforming or electroplating of a conductor such as nickel in holes drilled through the board. For example, the basic process of producing a unitube printed circuit board involves the drilling of holes in an epoxy fiber glass board/aluminum laminate, electroforming nickel in the holes, and then dissolving the aluminum to leave the nickel tubes protruding from the board. These protruding can then serve as the basis for the attachment of leads to the board by means such as welding. Thus, the thickness, hardness and ductility of the tubes must be favorably disposed to produce acceptable welds.

While various methods and devices have been developed to produce unitubes having uniform plating thickness across the board together with qualities, having the necessary weldable qualities, each present solution appears to have certain inherent limitations and/or drawbacks. For example, it has been found that cathode shields, such as described in U.S. Pat. No. 3,429,786 have the disadvantage of using considerable space in the electroforming tank and require assembly to the cathode before the plating operation. Also, these shields tend to restrict agitation of the electroforming solution across the face of the cathode and thus may increase pitting of the electrodeposit. Such shields provide shielding for the redundant side only. Therefore, after the initial plating time, the operator must place the two plating racks face to face in order to prevent overgrowth of the circuits and to continue building up the circuits. This causes inferior plating on the surface due to the low current density. Attempts to improve the plating uniformity and unitube ductility by varying the constituents in the nickel sulfamate plating solution and by varying the conditions of temperature, time, pH, and current density did not provide satisfactory results.

Examples of unitube manufacturing processes which might utilize the present invention are disclosed in U.S. Pat. Nos. 3370351, 3396459, 3426427, 3429036, 3429037, 3429038, 3431641, 3462832 and 3508330 plus U.S. Ser. No. 329,798 filed Feb. 5, 1973 now U.S. Pat. No. 3,819,430 and U.S. Ser. No. 374,747 filed June 28, 1973 now U.S. Pat. No. 3,855,692.

SUMMARY OF THE INVENTION

In the electoforming process of plating a conductive material in a hole in a printed circuit board, the anode is shielded to accurately control the anode current density. By increasing the current density of the shielded anode, weldable tubes can be produced on the printed circuit boards.

DESCRIPTION OF THE PREFERRED EMBODIMENTS

In the electroforming or electroplating of a conductor such as nickel on a printed circuit board, the board is arranged on a cathode bar and immersed in a sulfamate nickel plating solution together with an anode basket. Applying current to the anode and cathode will plate the nickel on the printed circuit board. While plating thickness is basically a function of time and current (ampere-hour) in the plating solution, other factors require important consideration to repeatably produce an acceptable product. For example, hardness and ductility must be controlled to prevent cracking of the tube during subsequent welding. A deposit hardness not exceeding 30 Rockwell C when using a 500 gram load on the Tukon tester has been found to be satisfactory.

Figure 1:
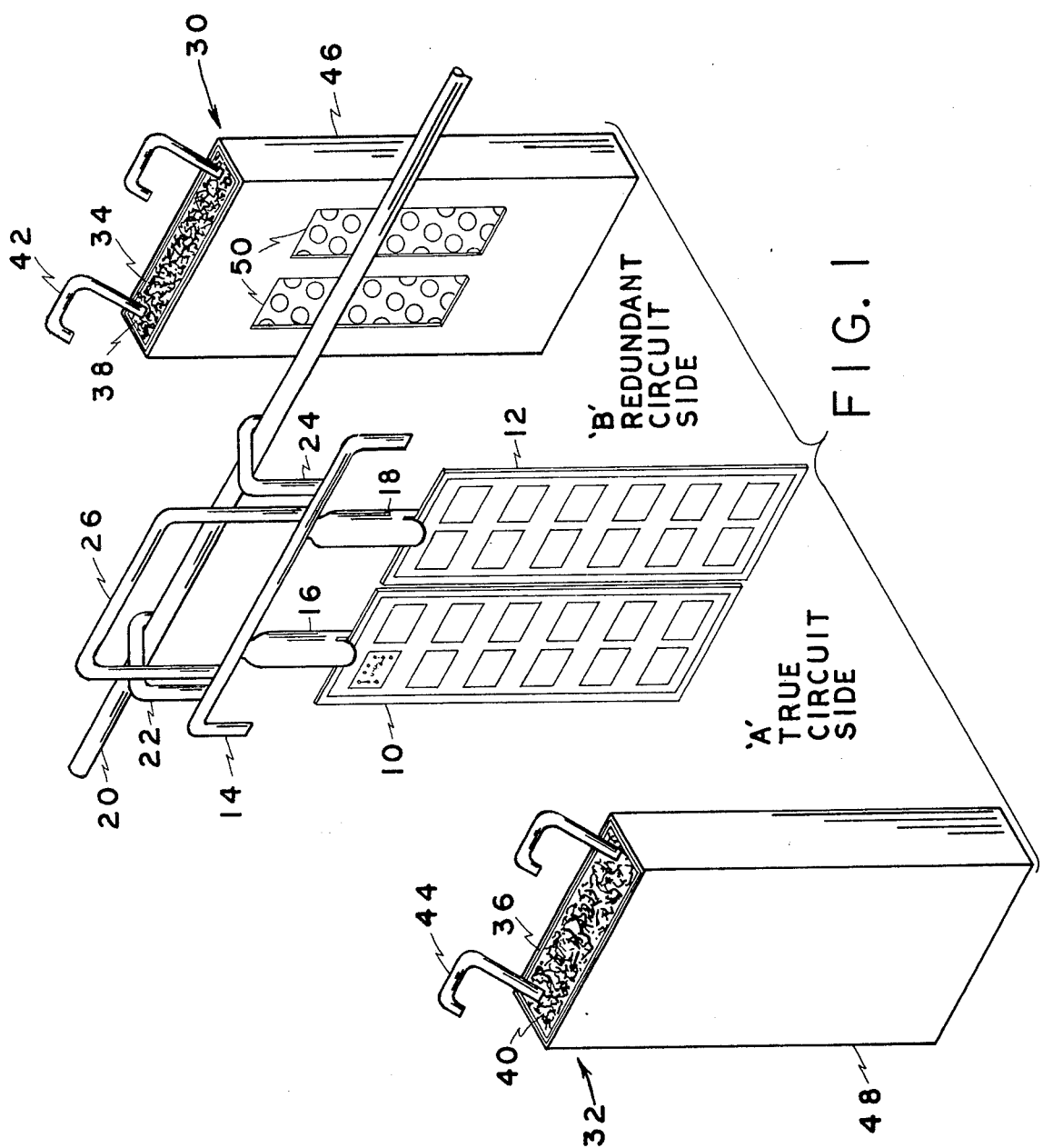
FIG. 1 is a view illustrating an embodiment of the present invention looking towards the true circuit side of the printed circuit board.
Figure 2:
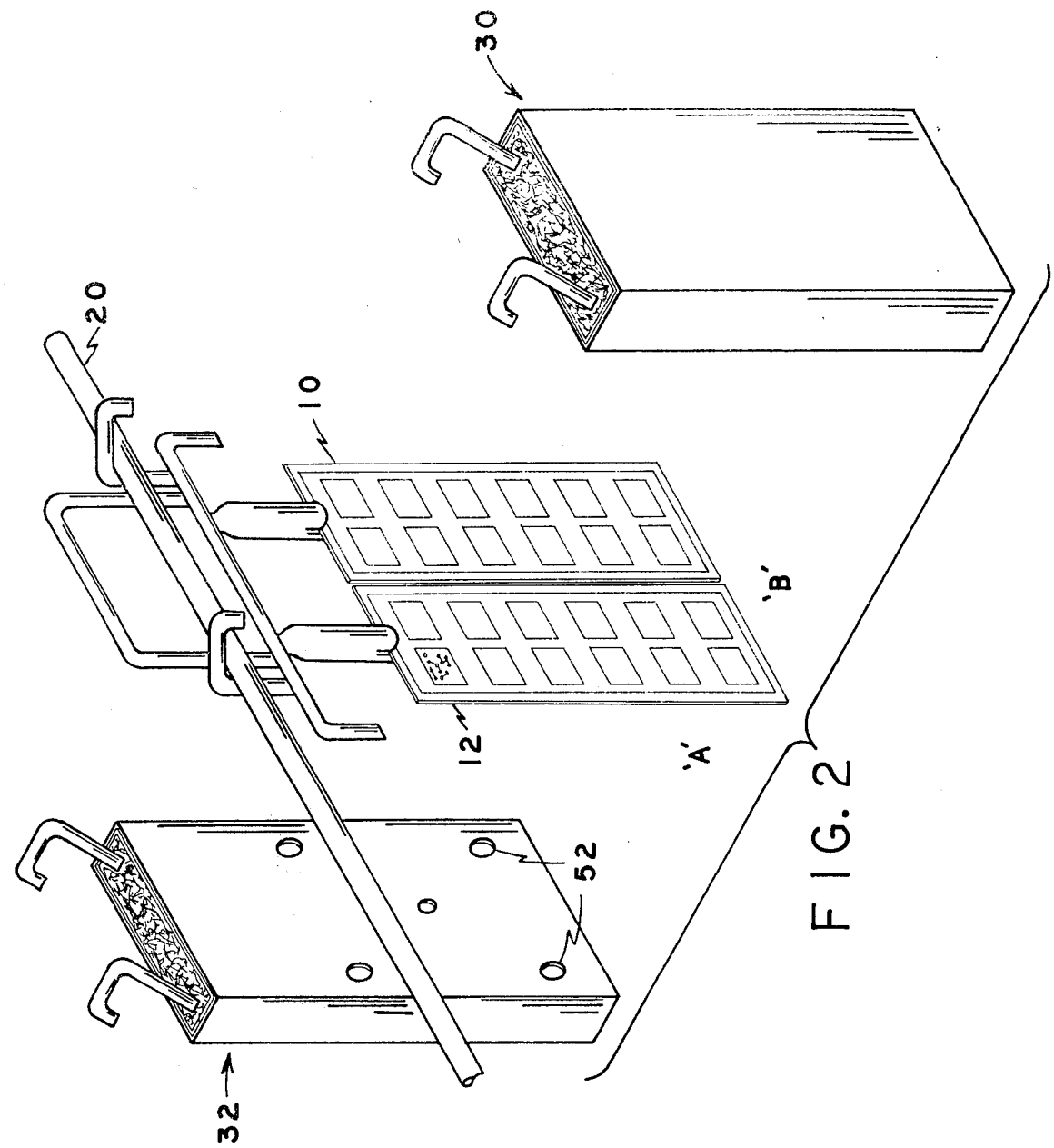
FIG. 2 is a view of the FIG. 1 embodiment looking towards the redundant circuit side of the printed circuit board.

As shown in FIGS. 1 and 2, two printed circuit boards 10 and 12 are suspended from a frame 14 by means of clips 16 and 18 respectively. The frame 14 is supported from the cathode bar 20 by hooks 22 and 24. A handle 26 is also affixed to the frame 14 to facilitate handling.

The printed circuit boards 10 and 12 have a true circuit side A which is the side on which the finished circuit is to be formed and a redundant circuit side B. The redundant side B is not part of the finished product and is removed, for example by sanding, in a later processing step. Because of circuit spacing and hole diameter requirements, it may be necessary to build up more of a tube thickness (in the drilled hole) through the redundant side B of the board than through the true circuit side A.

A redundant circuit side anode 30 is suspended in the sulfamate nickel plating solution on the redundant circuit side B of the printed circuit boards 10 and 12. Likewise a true circuit side anode 32 is immersed in the solution on the true circuit side A.

Each anode 30 and 32 generally comprises a titanium basket 34 and 36 filled with nickel chips 38 and 40 suspended by means of anode hooks 42 and 44 respectively. The sulfamate nickel plating solution may comprise the following:

| | |
|---|---|
| Nickel (as nickel sulfamate) | 75–100 grams/liter |
| Nickel Chloride | 10– 15 grams/liter |
| Boric Acid | 35– 45 grams/liter | and having a pH between 3.5 and 4.0 with a maximum surface tension of 35 dynes/centimeter.

The anodes 30 and 32 are covered by non-conductive shields 46 and 48 respectively. These shields 46 and 48 may be of any plastic type material such as a vacuum formed polyvinylchloride to cover all 4 sides of the anode basket. The top and bottom of the anode basket need not be covered although the shields would normally also cover the bottom of the baskets.

A predetermined area of the surface of anode shield facing the printed circuit board cathode would be cut away to expose that predetermined area of the anode to the printed circuit board cathode. The smaller the exposed anode area, the greater the resistance of the plating system and the higher the voltage required for a given current density. For example, with an anode/cathode ratio of ⅓, 6 volts were required whereas 1.6 volts were required for the factory recommended anode/cathode ratio of 3/1 to obtain the same current density.

As illustrated in FIG. 1, the redundant circuit side anode shield 46 includes two generally vertical rectangular openings. This produces a ratio of exposed anode area to cathode printed circuit board plated area of approximately ½. The cathode facing surface of the true circuit side anode shield, shown in FIG. 2, includes 5 circular openings with a anode to cathode ratio of approximately ⅛. Neither ratio includes the area of the nickel chips in the anodes baskets but only the exposed anode basket area.

By providing each anode with a plastic shield having predetermined openings to expose only a portion of the anode to the cathode, a more uniform plated deposit can be achieved on the printed circuit board. Since the current is distributed more uniformly, extreme high and low current density areas can be eliminated. The cathode deflector rack with its inherent difficulties is no longer required.

Minimum tank voltage can be achieved by reducing the exposed anode area (increasing anode current density), allowing plating of cathodes having minimal areas such as, printed circuits. Whereas in conventional systems, with high ratio of anode area to cathode area, minimum voltage would not be obtainable without treating the plated deposit on the higher current density areas.

By varying the openings of the shields on either side of the cathode printed circuit board, the rate of plating on each side of the board can be separately controlled. In addition, changes in the location of the openings in the anode shields can be utilized to accomodate changes in the printed circuit board cathode configuration, shifting the plating deposit as required.

Most importantly the anode shielding enable the voltage requirement for the needed current density to plate the nickel deposit to be raised. Maintaining this higher voltage level will increase the anode current density and produce a very ductile electroformed nickel tube which can be easily resistance welded to electronic component leads.

Although particular apparatus and procedures for carrying out the present invention have been illustrated and described, it is intended that these are provided by way of example only, the spirit and scope of this invention being limited only by the proper scope of the appended claims.

What we claimed is:

1. A method of electroforming nickel on a printed circuit board comprising the steps of:
   providing a bath of sulfamate nickel plating solution;
   immersing a printed circuit board cathode in the plating solution;
   immersing a titanium wire anode basket containing nickel chips in the plating solution in an operational relationship to the cathode;
   shielding the anode in a non-conductive plastic shield having a plurality of openings disposed in a predetermined pattern on the surface of said shield facing the cathode; and
   passing a current through said anode to electrodeposit nickel from said nickel chips on said printed circuit board cathode.

2. A method of electroforming nickel on a printed circuit board comprising the steps of:
   providing a bath of sulfamate nickel plating solution;
   immersing a printed circuit board cathode in the plating solution;
   immersing a first titanium wire anode basket containing nickel chips in the plating solution on one side of the cathode;
   immersing a second titanium wire anode basket containing nickel chips in the plating solution on the opposed side of the cathode;
   shielding the anodes in non-conductive plastic shields having a plurality of openings disposed in a predetermined pattern on the surface of said shields facing the cathode; and
   passing a current through the anode to electrodeposit nickel from said nickel chips on said printed circuit board cathode.

3. The method of claim 2 wherein the openings in the first anode shield are substantially greater than the openings in the second anode shield to electroform a greater thickness of nickel on the first anode side of said cathode than on the second anode side thereof.

4. A method of electroforming nickel on a printed circuit board comprising the steps of:
   providing a bath of sulfamate nickel plating solution;
   immersing a printed circuit board cathode having a redundant circuit side and an opposed true circuit side in the plating solution;
   immersing a first titanium wire anode basket containing nickel chips in the plating solution on the redundant circuit side of the cathode;
   immersing a second titanium wire anode basket containing nickel chips in the plating solution on the true circuit side of the cathode;
   shielding the first anode basket in a first non-conductive plastic anode shield having four substantially flat surfaces disposed around and substantially enclosing said first anode basket, said first anode shield having a plurality of vertically extending rectangular openings disposed in a predetermined pattern on the one flat surface of said first shield facing the redundant circuit side of the cathode;
   shielding the second anode basket in a second non-conductive plastic anode shield having four substantially flat surfaces disposed around and substantially enclosing said second anode basket, said second anode shield having a plurality of spaced circular openings disposed in a predetermined pattern on the one flat surface of said second anode shield facing the true circuit side of the cathode; and
   passing a current through the anodes to electrodeposit nickel on both the redundant circuit side and the true circuit side of said printed circuit board cathode.

5. The method of claim 4 wherein the openings in the first anode shield are substantially greater in flat surface area than the openings in the second anode shield to electroform a greater thickness of nickel on the redundant circuit side of said cathode than on the true circuit side thereof.

* * * * *